(12) United States Patent
Danielson et al.

(10) Patent No.: US 6,998,327 B2
(45) Date of Patent: Feb. 14, 2006

(54) THIN FILM TRANSFER JOIN PROCESS AND MULTILEVEL THIN FILM MODULE

(75) Inventors: Jeffrey B. Danielson, Poughkeepsie, NY (US); Balaram Ghosal, Fishkill, NY (US); James Kuss, Claverack, NY (US); Matthew Wayne Oonk, Poughkeepsie, NY (US); Chandrika Prasad, Wappingers Falls, NY (US); Eric Daniel Perfecto, Poughkeepsie, NY (US); Roy Yu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 433 days.

(21) Appl. No.: 10/299,567

(22) Filed: Nov. 19, 2002

(65) Prior Publication Data

US 2004/0097078 A1    May 20, 2004

(51) Int. Cl.
*H01L 21/30* (2006.01)
*H01L 21/46* (2006.01)

(52) U.S. Cl. .................... 438/455; 438/456; 438/459
(58) Field of Classification Search ............. 257/734; 438/455–459, 464, 527, 977; 156/155, 272; 361/767, 770, 783; 174/262–265
See application file for complete search history.

(56) References Cited

U.S. PATENT DOCUMENTS

| | | | |
|---|---|---|---|
| 5,161,093 A | 11/1992 | Gorczyca et al. | |
| 5,170,931 A * | 12/1992 | Desai et al. | 228/180.22 |
| 5,174,766 A * | 12/1992 | Yoshizawa et al. | 439/91 |
| 5,276,955 A | 1/1994 | Noddin et al. | |
| 5,329,695 A | 7/1994 | Traskos et al. | |
| 5,534,094 A | 7/1996 | Arjavalingam et al. | |
| 5,534,466 A | 7/1996 | Perfecto et al. | |
| 5,699,234 A | 12/1997 | Saia et al. | |
| 6,183,588 B1 * | 2/2001 | Kelly et al. | 156/247 |
| 6,281,452 B1 | 8/2001 | Prasad et al. | |
| 6,372,608 B1 * | 4/2002 | Shimoda et al. | 438/455 |
| 6,756,286 B1 * | 6/2004 | Aspar et al. | 438/459 |

* cited by examiner

*Primary Examiner*—Duy-Vu N. Deo
(74) *Attorney, Agent, or Firm*—Ira D. Blecker

(57) ABSTRACT

A thin film transfer join process in which a multilevel thin film structure is formed on a carrier, the multilevel thin film structure is joined to a final substrate and then the carrier is removed. Once the carrier is removed, the dielectric material and metallic material that were once joined to the carrier are now exposed. The dielectric material is then etched back so that the exposed metallic material protrudes beyond the dielectric material. Also disclosed is a module made by the foregoing process.

12 Claims, 6 Drawing Sheets

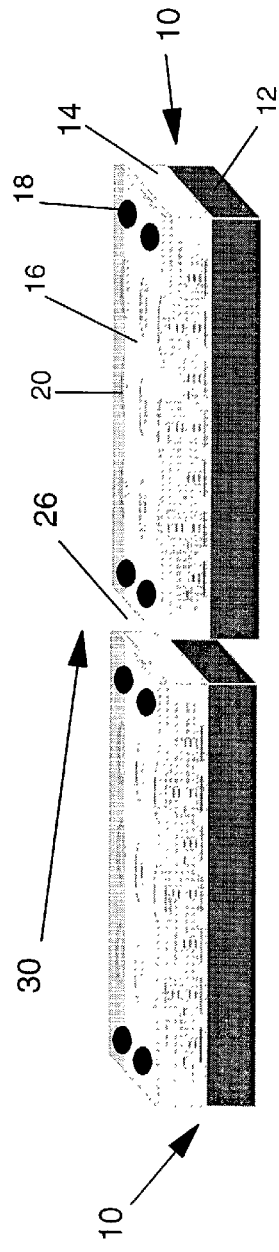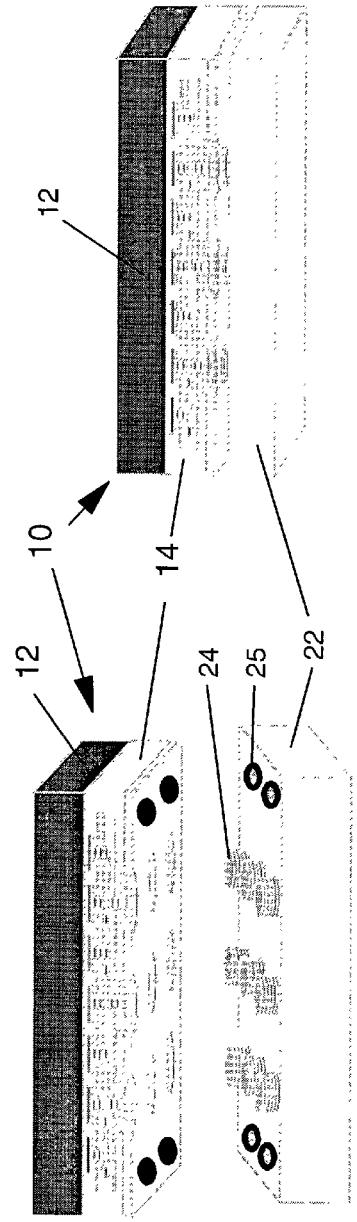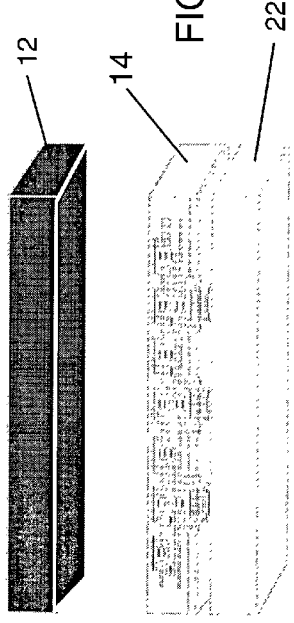

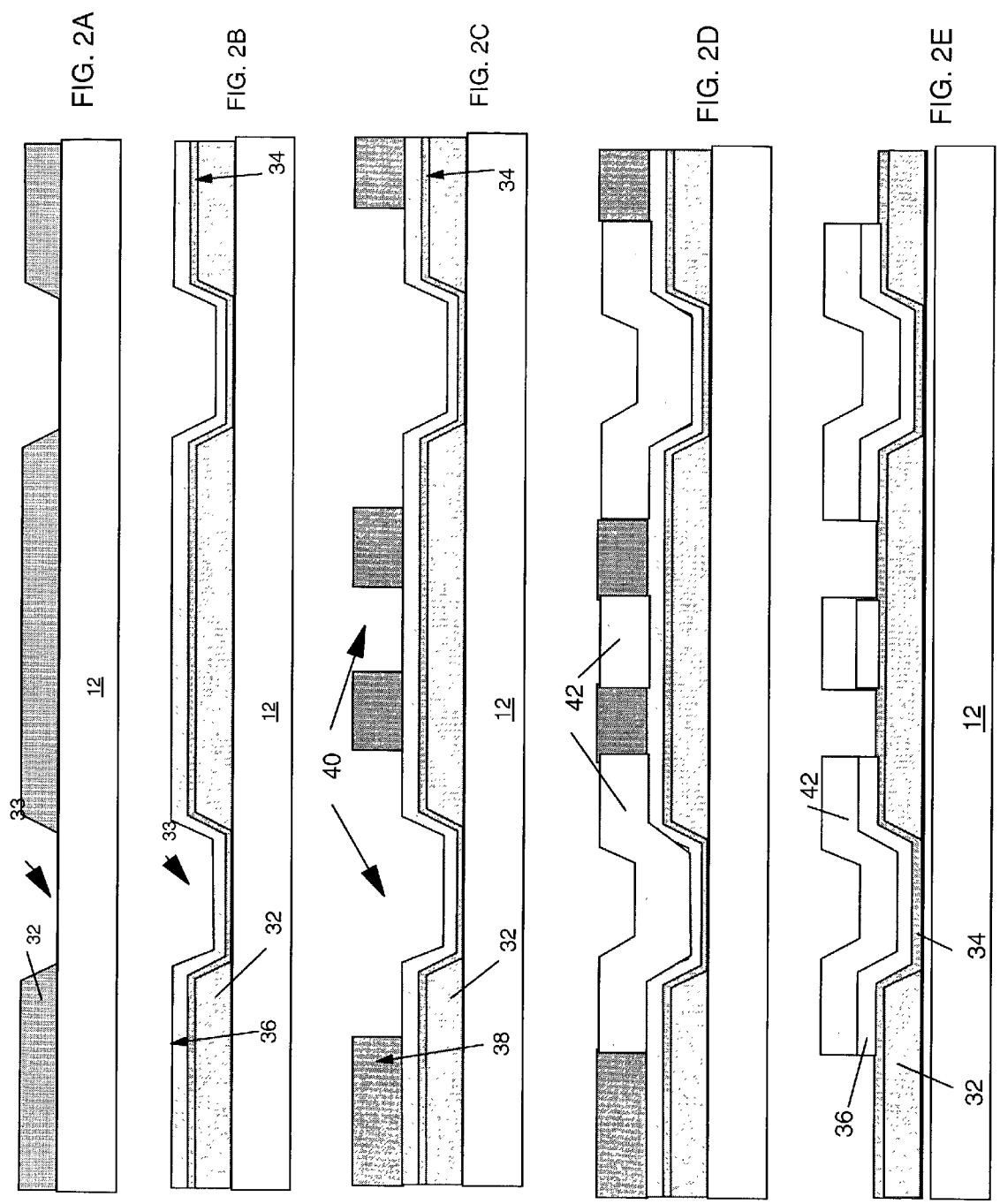

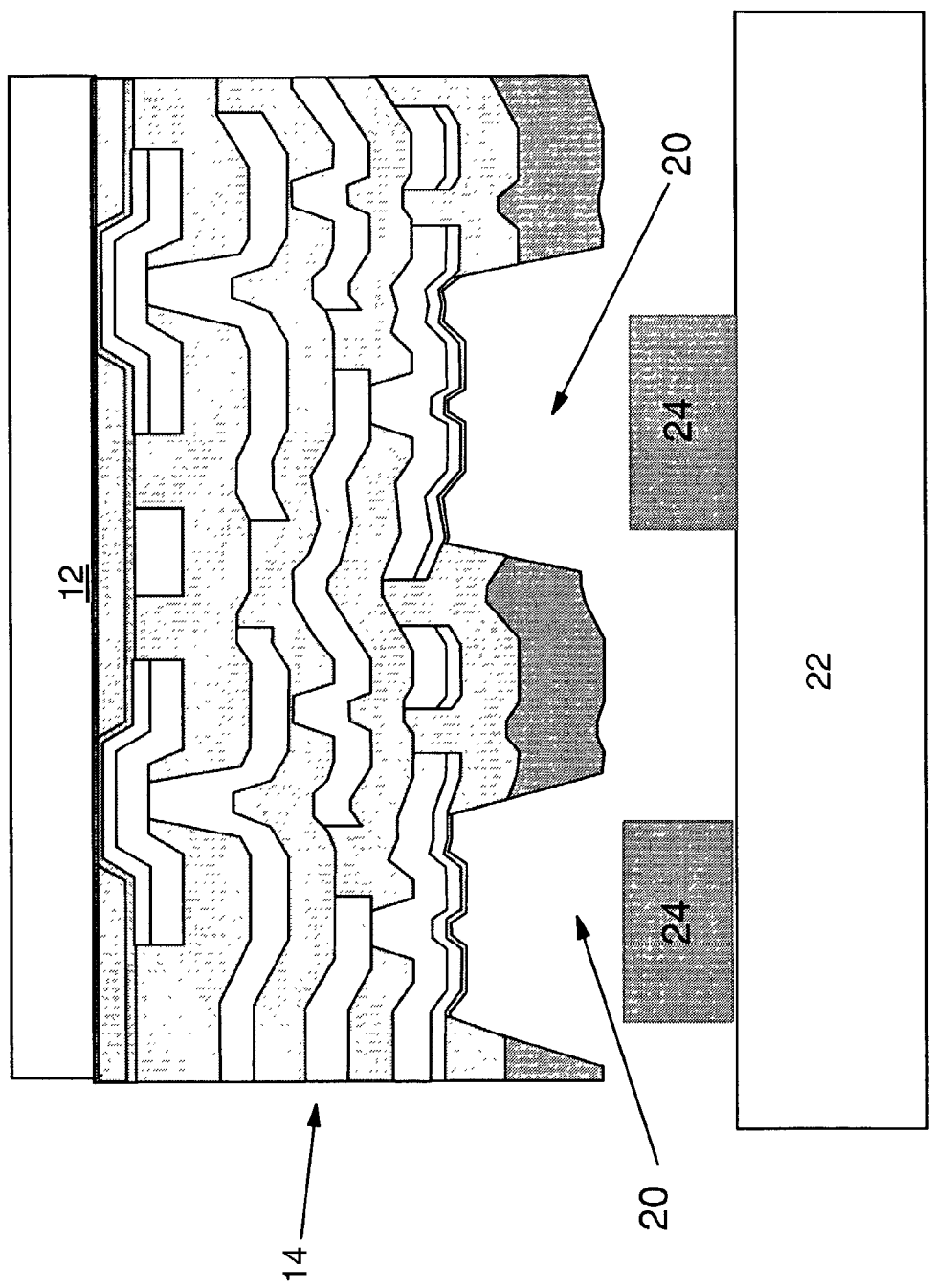

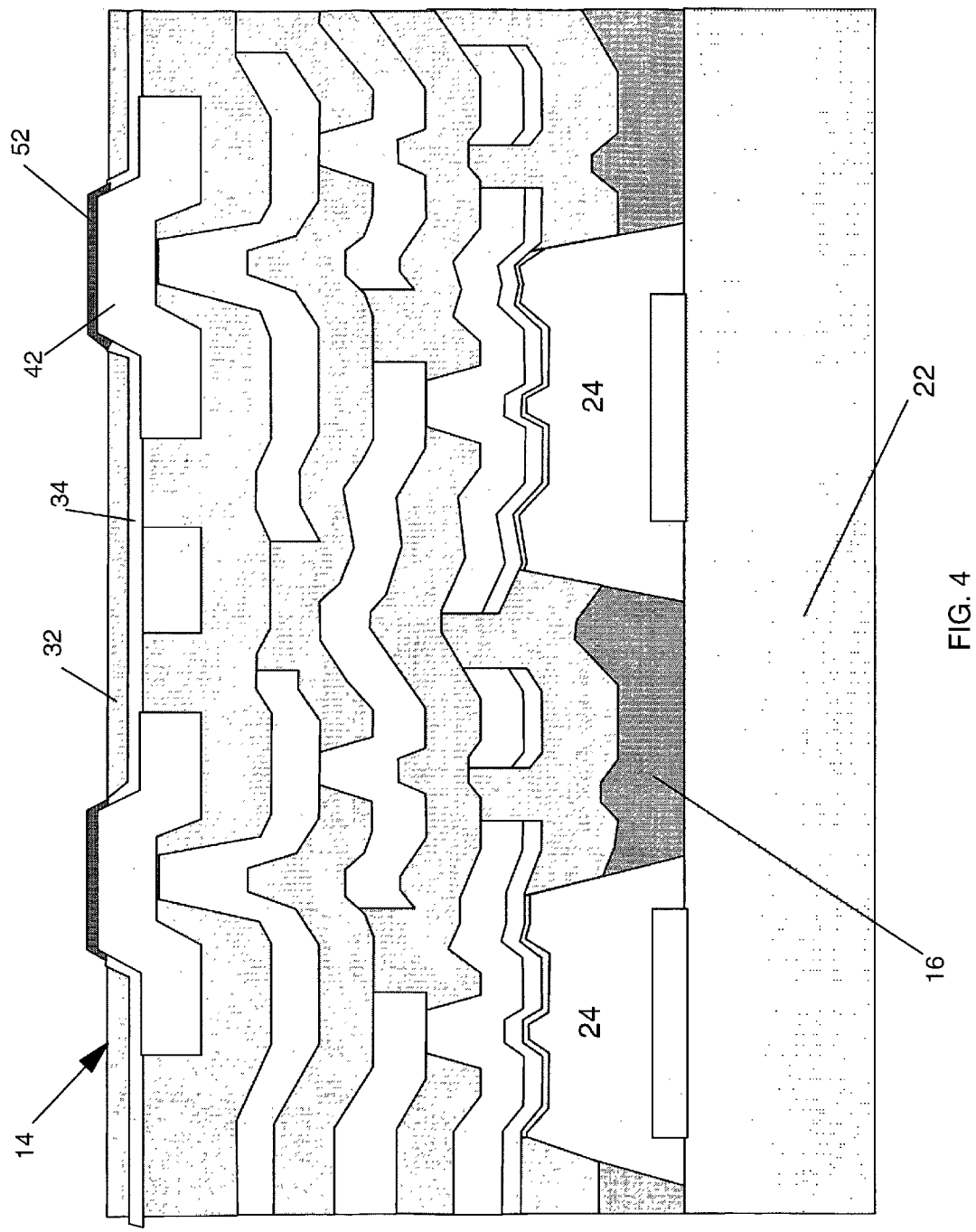

THIN FILM TRANSFER JOIN PROCESS AND MULTILEVEL THIN FILM MODULE

BACKGROUND OF THE INVENTION

The present invention relates to a multilayer thin film structure and a process for manufacturing the structure and mounting it on an electronic packaging substrate.

In general, a multilayer thin film structure is fabricated directly onto an electrically-good substrate such as a ceramic or glass-ceramic substrate. Such a fabrication process has several drawbacks including cost, work in progress concerns because of the serial nature of the manufacturing sequence, and undesirable processing/handling of highly-valued ceramic and glass-ceramic substrates. Further, if the fabricated multilayer thin film structure is defective, then an otherwise electrically-good substrate must be discarded or reworked, at considerable cost.

Various processing schemes have been proposed which allow for multilayer thin film structures to be fabricated separately from the electronic packaging substrate on which they will ultimately be employed. The following are examples of such processing schemes.

Perfecto et al. U.S. Pat. No. 5,534,466, the disclosure of which is incorporated by reference herein, disclose a method of making a multilayer thin film structure on a temporary glass carrier which then can be transferred to a substrate for permanent joining. In this method, the multilayer thin film structure is made in a "top down" format which becomes righted when it is permanently joined to the substrate. It is noted that the top metal ground plane is formed either flush with the surface, as shown in FIG. 9, or is recessed as shown in FIG. 15. Both of these embodiments present certain difficulties during testing. Further, the multilayer thin film structure is joined directly to the substrate which requires that the substrate be extremely planar to accommodate the rigid multilayer thin film structure.

Arjavalingam et al U.S. Pat. No. 5,534,094, the disclosure of which is incorporated by reference herein, discloses the manufacture of a multilayer thin film structure on a quartz carrier. Also included is a polymeric separation layer between the multilayer thin film structure and the quartz carrier which can be laser ablated so that the multilayer thin film structure can be easily separated from the quartz carrier in a later stage of manufacturing.

Prasad et al. U.S. Pat. No. 6,281,452, the disclosure of which is incorporated by reference herein, discloses a compliant polymeric spacer which joins and electrically connects the multilayer thin film structure to the substrate. The spacer as disclosed has a number of advantages including strain relief.

Gorczyca et al. U.S. Pat. No. 5,161,093, Noddin et al. U.S. Pat. No. 5,276,955, Traskos et al. U.S. Pat. No. 5,329,695 and Saia et al. U.S. Pat. No. 5,699,234, the disclosures of which are incorporated by reference herein, disclose other multilayer packaging schemes, some of which are also applicable to multilayer thin film structures.

It is a purpose of the present invention to have a thin film transfer join process and multilevel thin film module in which the chip joining pads are readily available for testing.

It is another purpose of the present invention to have a thin film transfer join process and multilevel thin film module in which the chip joining pads enhance the chip joining yield.

It is yet another purpose of the present invention to have a thin film transfer join process and multilevel thin film module in which limited processing must occur after the multilevel thin film structure is joined to the substrate.

These and other purposes will become more apparent after referring to the following description of the invention considered in conjunction with the accompanying drawings.

BRIEF SUMMARY OF THE INVENTION

The purposes of the present invention have been achieved by providing, according to a first aspect of the present invention, a thin film transfer join process comprising the steps of:
  providing a carrier for constructing a multilevel thin film structure;
  forming on the carrier a multilevel thin film structure comprising a dielectric material in contact with the carrier and a metallic material, at least a portion of the metallic material being exposed through the dielectric material and in contact with the carrier, the multilevel thin film structure having a joining surface opposite the carrier;
  providing a substrate;
  joining the joining surface to the substrate;
  removing the carrier;
  etching back the dielectric material that was in contact with the carrier so that the exposed metallic material protrudes beyond the dielectric material.

According to a second aspect of the invention, there is provided a multilevel thin film module comprising:
  a multilevel thin film structure comprising metallic material and dielectric material joined to a substrate, the multilevel thin film structure, on a surface opposite the substrate defined by the dielectric material, having a portion of the metallic material protruding beyond the dielectric material.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

FIGS. 1A to 1D schematically illustrate the thin film transfer join process according to the present invention comprising sectioning of the multilevel thin film structure into smaller "patches", aligning and tacking of a patch to a substrate and removal of the carrier.

FIGS. 2A to 2F illustrate the steps for formation of the multilevel thin film structure on a temporary carrier used in the present invention.

FIG. 3 illustrates the alignment of the multilevel thin film structure on a temporary carrier with a substrate.

FIG. 4 illustrates a final step in the process where the sacrificial release layer is removed and the dielectric layer etched back so that the metallic portion of the multilevel thin film structure protrudes beyond the dielectric layer.

DETAILED DESCRIPTION OF THE INVENTION

Figure 2F:
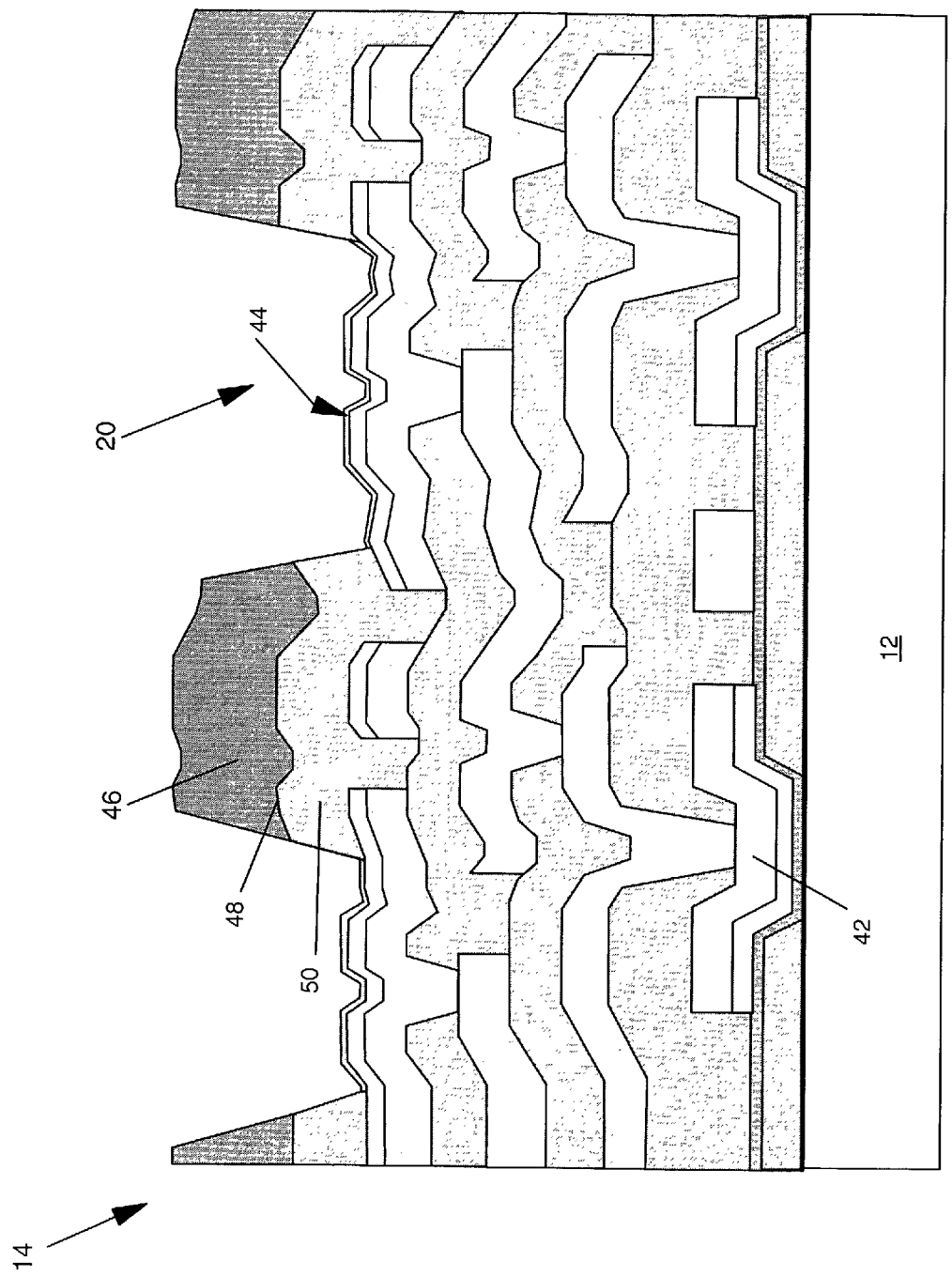

Referring to the Figures in more detail, and particularly referring to FIGS. 1A to 1D, there is schematically illustrated the thin film transfer join process according to the present invention. As shown in FIG. 1A, a sheet 30 comprising a multilevel thin film structure joined to a carrier is sectioned 26 into smaller sections 10 which are individually sized for joining to a semiconductor device (not shown). Each of the sections 10 comprises a carrier 12 and a multilevel thin film structure 14. Each of the multilevel thin film structures 14 may alternatively be called a "patch". In a most preferred embodiment, the multilevel thin film structure 14 includes an adhesive layer 16 for joining to the substrate 22 shown in FIG. 1B. The multilevel thin film structure 14 as well as adhesive layer 16 has openings 20 for receiving solder elements 24 on substrate 22. In a most preferred embodiment, adhesive layer 16 further includes anchor pads 18 which have no electrical function. When there are anchor pads 18, there will be corresponding solder elements 25 on substrate 22. The purpose of the anchor pads 18 is to provide stability to the multilevel thin film structure 14 when it is joined to the substrate 22. If there is no adhesive layer 16, then in a preferred embodiment of the present invention, anchor pads 18 may be directly on the multilevel thin film structure 14.

Referring now to FIG. 1B, one of the sections 10 comprising multilevel thin film structure 14 and carrier 12 is flipped over and aligned with substrate 22 and tacked to substrate 22 in FIG. 1C. In this latter process step, the adhesive layer 16 and solder elements 24, 25 are heated so that the adhesive layer 16 and anchor pads 18 are joined to the substrate 22 and solder elements 24, 25 are joined to the multilevel thin film structure 14. While substrate 22 is shown to be approximately the same size as section 10, substrate 22 could be larger than section 10 and could contain more than one section 10 and hence more than one multilevel thin film structure 14 joined to it.

Referring now to FIG. 1D, the carrier 12 is removed such as by the ablation process described in the foregoing Arjavalingam et al. U.S. Pat. No. 5,534,094. By the tacking process previously described with respect to FIG. 1C, the multilevel thin film structure 14 is restricted from changing in size after the carrier 12 is removed. The most preferred anchor pads 18 greatly facilitate the stabilization of the multilevel thin film structure 14 so that there is little or no change in size of the multilevel thin film structure after removal of the carrier 12. After removal of the carrier 12, the multilevel thin film structure 14 is laminated at a pressure (e.g., at a pressure of about 150 psi) and at an elevated temperature (e.g. at 380° C. for 97/3 weight percent lead/tin solder) to firmly adhere the multilevel thin film structure 14 to the substrate 22 and remove any air bubbles from the adhesive layer 16 if a most preferred adhesive layer 16 is used.

FIGS. 2A to 2F illustrate the process for forming the multilevel thin film structure 14. Referring first to FIG. 2A, a carrier 12 is provided on which the multilevel thin film structure 14 is to be built. The carrier 12 may be of any suitable material such as a glass, ceramic or glass-ceramic. If the tack and lamination temperatures are reduced to below about 260° C., the carrier 12 can also be an organic carrier such as SLC or HyperBGA. Applied to one surface of the carrier 12 is a layer of dielectric material 32. The dielectric material is conventional such as a polyimide. The dielectric material 32 may be patterned such as by, for example, laser ablation, to form open areas 33 which are exposed to the carrier 12.

Next, as shown in FIG. 2B, a sacrificial release layer 34 is deposited on the dielectric layer 32 and in the openings 33. The sacrificial release layer 34 is chosen to allow subsequent metallic material to be released from the carrier 12 and also to be compatible with the dielectric layer 32. If the dielectric layer 32 is polyimide, then sacrificial release layer 34 is preferably a lower viscosity polyimide and is put down in a layer that is about 1 micron thick. The sacrificial release layer 34 must be compatible with the dielectric layer 32 since part of the sacrificial release layer 34 remains with the multilevel thin film structure 14 when it is completed. Subsequent to the formation of the sacrificial release layer 34, a conventional seed layer 36 is deposited such as by sputtering. Seed layer 36 preferably comprises chromium (about 400 angstroms) followed by copper (about 2500 angstroms).

Referring now to FIG. 2C, a photoresist layer is deposited, patterned, exposed and developed to result in photoresist areas 38 as is well known to those skilled in the art. Open areas 40 will receive a metallic material in the next step of the process. A negative or positive photoresist can be used. The present inventors prefer a positive photoresist.

Subsequently, metallic material 42 is electroplated using seed layer 36 as one electrode as shown in FIG. 2D. Metallic material may be any metallic material that is useful in electronic applications. For the purposes of the present invention, the present inventors prefer a first approximately 2 micron layer of nickel followed by a second approximately 4 micron layer of copper.

Referring now to FIG. 2E, photoresist areas 38 have been stripped and seed layer 36 etched in a suitable etchant as is well known to a person skilled in the art.

Thereafter, the remainder of the multilevel thin film structure 14 is built in conventional fashion. Briefly, dielectric material (polyimide for example) is deposited over sacrificial release layer 34 and metallic material 42, vias are opened such as by laser ablation, seed metal (e.g., Cr/Cu) is deposited, resist is deposited, exposed and developed, wiring and via metallization (preferably Cu) is electroplated and then the photoresist is stripped and the seed metal etched. These steps are repeated until the entire multilevel thin film structure 14 is completed. At the end of the process, terminal metals Ni/Cu/Au may be deposited on the last layer of copper metallization.

The finished multilevel thin film structure 14 is illustrated in FIG. 2F. The multilevel thin film structure 14 has been built in a "top down" configuration so that when the multilevel thin film structure 14 is joined by terminal metals 44 to the substrate 22, the metallization 42 will be on top and, after subsequent processing as described hereafter, ready for joining with a semiconductor device (not shown). As will be explained in more detail hereafter, the multilevel thin film structure 14 also includes open areas 20 for the receipt of solder 24 from substrate 22. In a most preferred embodiment, adhesive 46 is applied, most preferably spin applied, to the surface 48 of the multilevel thin film structure 14 that is not in contact with carrier 12. The adhesive 46 is then opened, usually in conjunction with the last level 50 of dielectric deposited, to form open areas 20. It is preferred that a high temperature adhesive be utilized since the adhesive will have to withstand solder reflow temperatures. The present inventors prefer a thermoplastic polyimide material, manufactured under the tradename DuPont KJ by E.I. DuPont de Nemours, Wilmington, Del.

After the multilevel thin film structure 14 has been completed, it may be joined to the substrate 22. As shown in FIG. 3, the carrier 12 and multilevel thin film structure 14 are inverted and open areas 20 of the multilevel thin film structure 14 are aligned with solder 24 on substrate 22. As explained earlier with reference to FIGS. 1C and 1D, the multilevel thin film structure 14 is additionally tacked to substrate 22 and then the carrier 12 is removed. The substrate 22 can be any kind of substrate that is usable for electronic applications including ceramic, glass-ceramic, and organic.

Once the carrier 12 has been removed from the multilevel thin film structure 14, the sacrificial release layer 34 covers metallization 42. This is now the top surface of multilevel thin film structure 14. As metallization 42 will be the contact pad for joining with a semiconductor device, the sacrificial release layer 34 and preferably also the seed metal 36 must be removed. Accordingly, the multilevel thin film structure 14 undergoes processing as follows. The top surface of the multilevel thin film structure 14 is contacted with an $O_2$ ash or, more preferably, blanket laser cleaning to remove the sacrificial release layer 34 that covers the seed metal 36. This step also causes the dielectric layer 32 to be etched back. The seed metal 36 is then etched to expose the metallization 42. At this point, the metallization 42 or contact pad protrudes beyond the surface of dielectric layer 32 as shown in FIG. 4. An immersion gold layer 52 may then be deposited on metallization 42 to complete the structure. FIG. 4 also shows solder elements 24 that have been reflowed.

An advantage of the contact pad 42 extending beyond the dielectric layer 32 is that easier testing of the package may be accomplished in that a test cloth rather than a probe may be used for testing. Further, the protruding contact pads 42 enhance chip joining yields.

Figure 5:
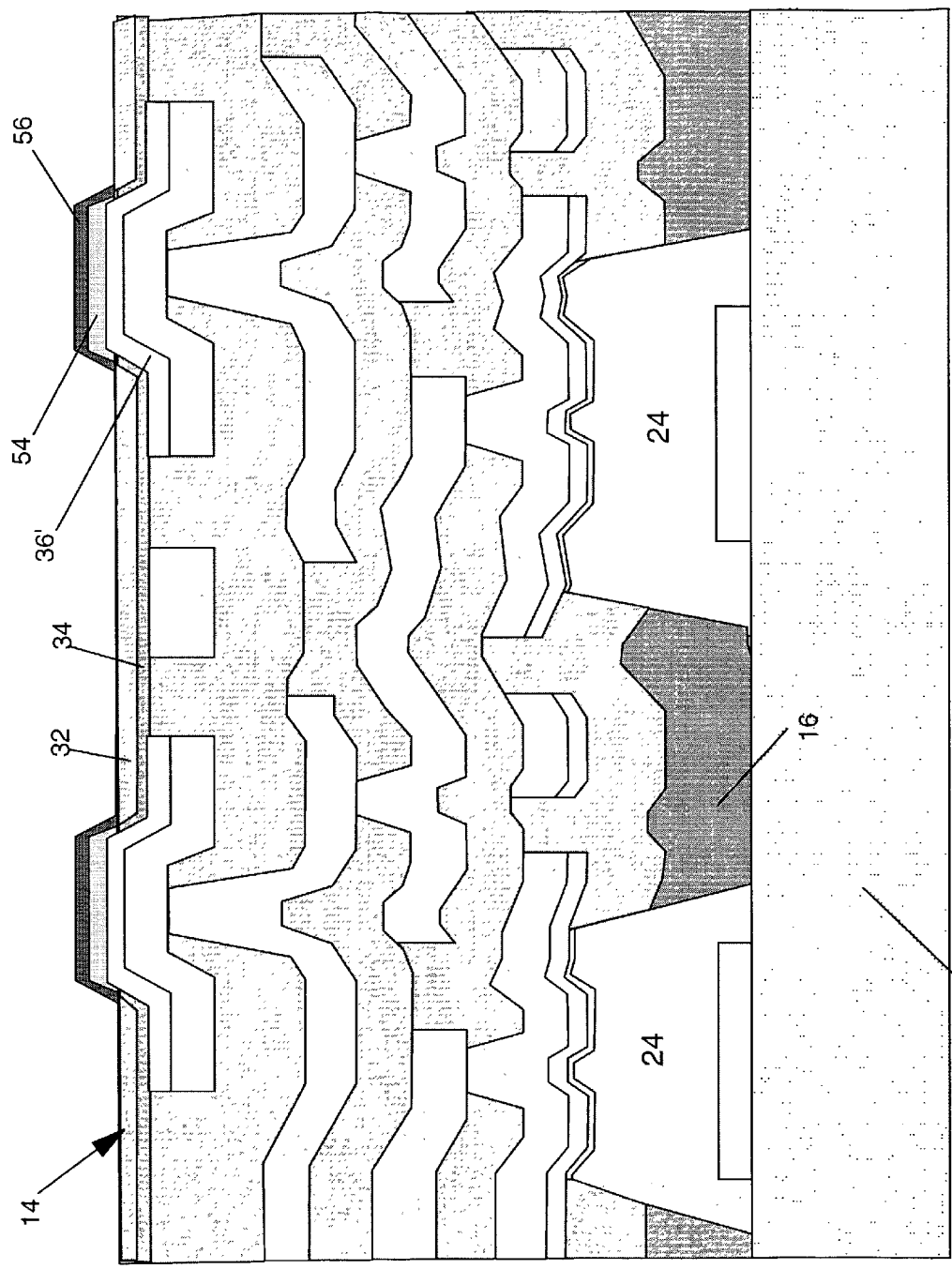
FIG. 5 illustrates an alternative to the final step in FIG. 4.

The finishing operation illustrated in FIG. 4 may be varied. After removal of the sacrificial release layer 34, the Cr seed layer is etched away but the Cu seed layer 36' (assuming Cr/Cu layers were initially used as the seed metal 36) stays. Thereafter, nickel phosphorus 54 is deposited on the Cu seed metal layer followed by an immersion gold layer 56 to complete the structure as shown in FIG. 5. As a further variant and assuming that metallization 42 initially included a nickel layer followed by a copper layer, the initial nickel layer may be avoided since the nickel phosphorus layer 54 serves the purpose of that initial nickel layer.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A thin film transfer join process comprising the steps of:
providing a carrier for constructing a multilevel thin film structure;
forming on the carrier a multilevel thin film structure comprising a dielectric material in contact with the carrier and a metallic material, at least a portion of the metallic material being exposed through the dielectric material and in contact with the carrier, the multilevel thin film structure having a joining surface opposite the carrier;
providing a substrate;
joining the joining surface to the substrate;
removing the carrier,
etching back the dielectric material that was in contact with the carrier so that the exposed metallic material protrudes beyond the dielectric material.

2. The process of claim 1 further comprising the step of depositing gold on the exposed metallic material.

3. The process of claim 1 further comprising the steps of:
depositing a second metallic material on the exposed metallic material; and
depositing gold on the second metallic material.

4. The process of claim 1 further comprising the step prior to joining of forming a spacer material on the joining surface wherein the spacer material is joined to the substrate.

5. The process of claim 4 wherein the spacer material comprises an adhesive material.

6. The process of claim 5 wherein the adhesive material is a thermoplastic polyimide.

7. The process of claim 4 wherein the step of forming a spacer material comprises spin applying an adhesive material.

8. The process of claim 7 wherein the adhesive material is a thermoplastic polyimide.

9. The process of claim 1 wherein the joining surface comprises a plurality of anchor pads around a periphery of the joining surface.

10. The process of claim 9 wherein the anchor pads provide no electrical function.

11. The process of claim 1 further comprising the step prior to joining of sectioning the multilevel thin film structure and carrier into a plurality of smaller multilevel thin film structures attached to smaller carriers.

12. The process of claim 1 wherein the step of forming a multilevel thin film structure comprises the steps of:
depositing a layer of dielectric material;
forming at least one opening in the layer of dielectric material so that a portion of the carrier is exposed;
depositing a release layer on the layer of dielectric material into the at least one opening and on the exposed portion of the carrier, the release layer allowing the multilevel thin film structure to be separated from the carrier; and
filling the at least one opening with a metallic material.

\* \* \* \* \*